(12) United States Patent
Malthaner et al.

(10) Patent No.: US 11,828,784 B2
(45) Date of Patent: Nov. 28, 2023

(54) METHOD FOR CHECKING AN OUTPUT STAGE FOR CONTROLLING A LOAD

(71) Applicant: Robert Bosch GmbH, Stuttgart (DE)

(72) Inventors: Manuel Malthaner, Stuttgart (DE); Lars Rinze, Hamburg (DE); Markus Stumpp, Aichwald (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 16/763,722

(22) PCT Filed: Dec. 18, 2018

(86) PCT No.: PCT/EP2018/085404
§ 371 (c)(1),
(2) Date: May 13, 2020

(87) PCT Pub. No.: WO2019/121623
PCT Pub. Date: Jun. 27, 2019

(65) Prior Publication Data
US 2020/0371149 A1 Nov. 26, 2020

(30) Foreign Application Priority Data
Dec. 20, 2017 (DE) .......................... 102017223327.3

(51) Int. Cl.
*G01R 31/52* (2020.01)
*G01R 31/00* (2006.01)
(Continued)

(52) U.S. Cl.
CPC ....... *G01R 31/007* (2013.01); *G01R 31/3277* (2013.01); *G01R 31/50* (2020.01); *G01R 31/52* (2020.01)

(58) Field of Classification Search
CPC .............. G01R 31/007; G01R 31/3277; G01R 31/3278; G01R 31/50–74
See application file for complete search history.

(56) References Cited

U.S. PATENT DOCUMENTS 4,524,321 A * 6/1985 Jablway ................. G01R 31/60
324/66
4,862,091 A * 8/1989 Hillebrand ............. G01R 31/58
324/415

(Continued)

FOREIGN PATENT DOCUMENTS

| CN | 101335449 A | 12/2008 |
| CN | 101431227 A | 5/2009 |

(Continued)

OTHER PUBLICATIONS

International Search Report for PCT/EP2018/085404, dated Mar. 28, 2019.

*Primary Examiner* — Patrick Assouad
*Assistant Examiner* — Demetrius R Pretlow
(74) *Attorney, Agent, or Firm* — NORTON ROSE FULBRIGHT US LLP; Gerard Messina

(57) ABSTRACT

A method for checking an output stage for controlling a load, wherein the output stage for controlling the load can be switched to a first switching state or to a second switching state. In the first switching state, a check for a first fault state may be carried out; in the second switching state, a check for a second fault state may be carried out; when the output stage is operated in the first switching state, the output stage is switched to the second switching state for a first control duration, the check for the second fault state is performed, and the output stage is switched back to the first switching state after the first control duration.

11 Claims, 4 Drawing Sheets

(51) Int. Cl.
*G01R 31/327* (2006.01)
*G01R 31/50* (2020.01)

(56) References Cited

U.S. PATENT DOCUMENTS

| | | | | |
|---|---|---|---|---|
| 5,372,410 A * | 12/1994 | Miller | | B60T 8/404 |
| | | | | 188/181 C |
| 5,521,832 A * | 5/1996 | Kornhaas | | G01R 31/2829 |
| | | | | 702/58 |
| 5,648,759 A * | 7/1997 | Miller | | B60T 8/404 |
| | | | | 340/660 |
| 5,872,460 A * | 2/1999 | Bennett | | B60R 21/0173 |
| | | | | 324/762.09 |
| 7,952,488 B1 * | 5/2011 | Zansky | | G01R 31/40 |
| | | | | 340/693.1 |
| 9,678,139 B2 * | 6/2017 | Kisslinger da Silva | | |
| | | | | G01R 19/16519 |
| 9,991,694 B1 * | 6/2018 | Handshoe | | G01R 31/58 |
| 2003/0169550 A1 * | 9/2003 | Burk | | H03K 17/18 |
| | | | | 361/91.2 |
| 2008/0084229 A1 * | 4/2008 | Frommer | | G01R 31/34 |
| | | | | 324/765.01 |
| 2008/0197696 A1 * | 8/2008 | Degoul | | B60T 17/22 |
| | | | | 303/115.4 |
| 2011/0115564 A1 * | 5/2011 | Tung | | H03F 1/523 |
| | | | | 330/298 |
| 2012/0109547 A1 * | 5/2012 | Willey | | H05B 1/0236 |
| | | | | 702/58 |
| 2013/0057065 A1 * | 3/2013 | Rinze | | F02N 11/101 |
| | | | | 307/10.6 |
| 2013/0162284 A1 | 6/2013 | Kisslinger Da Silva | | |
| 2013/0181729 A1 * | 7/2013 | Egan | | G01R 31/40 |
| | | | | 324/750.01 |
| 2013/0234744 A1 * | 9/2013 | Carbonaro | | G01R 31/50 |
| | | | | 324/750.03 |
| 2013/0249564 A1 * | 9/2013 | Ripley | | G01R 31/52 |
| | | | | 324/509 |
| 2013/0270901 A1 * | 10/2013 | Salziger | | B60L 3/12 |
| | | | | 307/9.1 |
| 2014/0285930 A1 * | 9/2014 | Powell | | G01R 31/52 |
| | | | | 361/139 |
| 2014/0327450 A1 * | 11/2014 | Schmauss | | G01R 31/3277 |
| | | | | 324/538 |
| 2016/0025792 A1 * | 1/2016 | Oestreicher | | G05B 23/00 |
| | | | | 324/538 |
| 2016/0061898 A1 * | 3/2016 | Edwards | | G01R 31/3277 |
| | | | | 324/538 |
| 2016/0377666 A1 * | 12/2016 | Kume | | H03K 5/08 |
| | | | | 324/764.01 |
| 2018/0278045 A1 * | 9/2018 | Watanabe | | H02M 3/157 |
| 2021/0091705 A1 * | 3/2021 | Bhat | | H02P 29/024 |

FOREIGN PATENT DOCUMENTS

| | | | | |
|---|---|---|---|---|
| CN | 102539992 A | 7/2012 | | |
| CN | 102959412 A | 3/2013 | | |
| CN | 104269813 A | 1/2015 | | |
| CN | 104702254 A | 6/2015 | | |
| CN | 105305388 A | 2/2016 | | |
| DE | 19705339 A1 | 8/1998 | | |
| DE | 19920465 C1 | 11/2000 | | |
| DE | 10320926 A1 * | 12/2004 | | H02H 7/0844 |
| DE | 10320926 A1 | 12/2004 | | |
| DE | 60104845 T2 | 9/2005 | | |
| DE | 102007002953 A1 | 7/2008 | | |
| DE | 102007050298 A1 * | 4/2009 | | H02H 7/0838 |
| DE | 102011077407 A1 | 12/2012 | | |
| DE | 102012111070 A1 | 5/2014 | | |
| DE | 102013204573 A1 * | 9/2014 | | H03K 17/18 |
| DE | 102014202460 B3 | 2/2015 | | |
| DE | 102016204806 A1 | 9/2017 | | |
| EP | 0730348 A2 | 9/1996 | | |
| EP | 0810444 A1 | 12/1997 | | |
| TW | 200825436 A | 6/2008 | | |

* cited by examiner

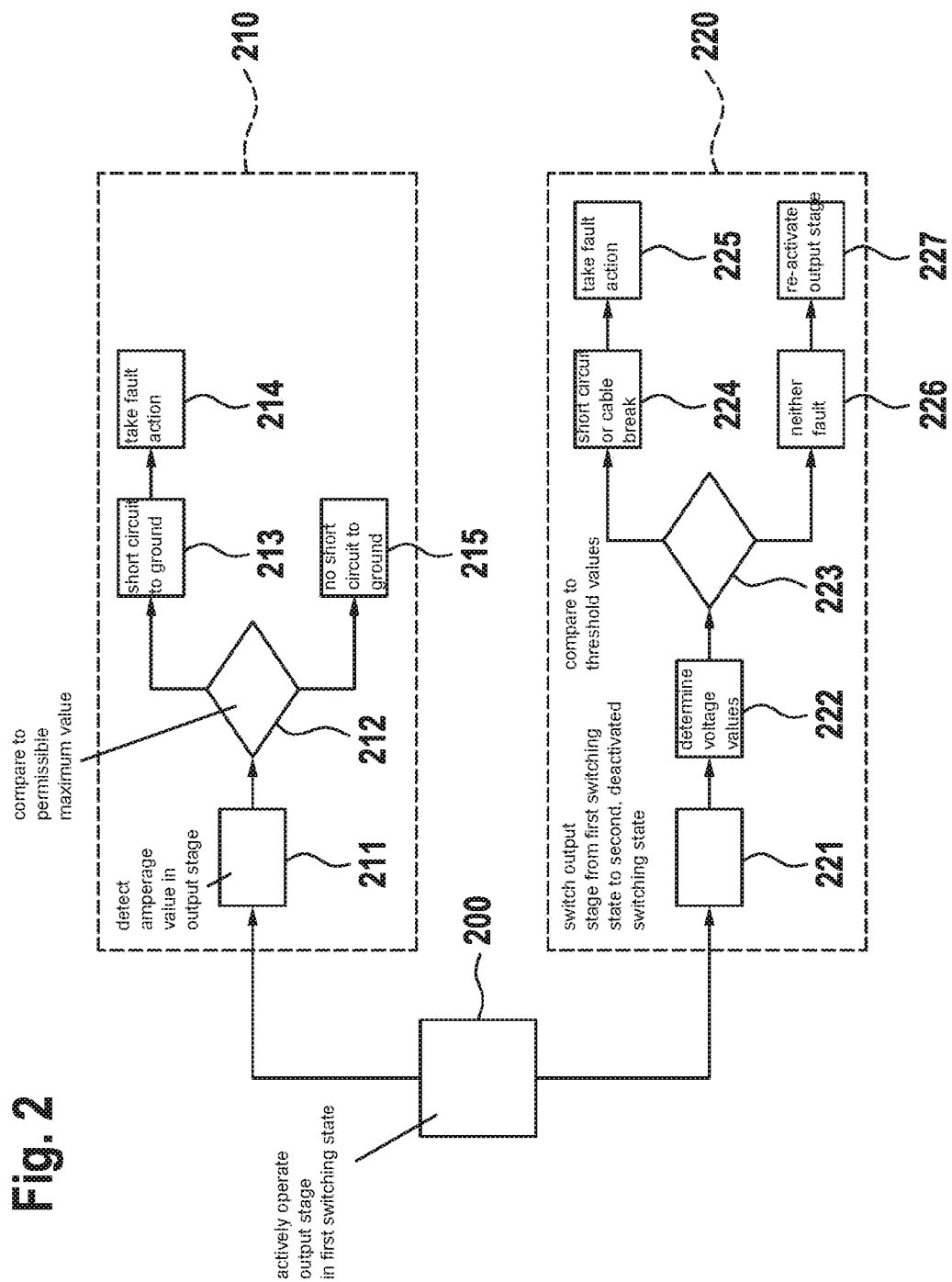

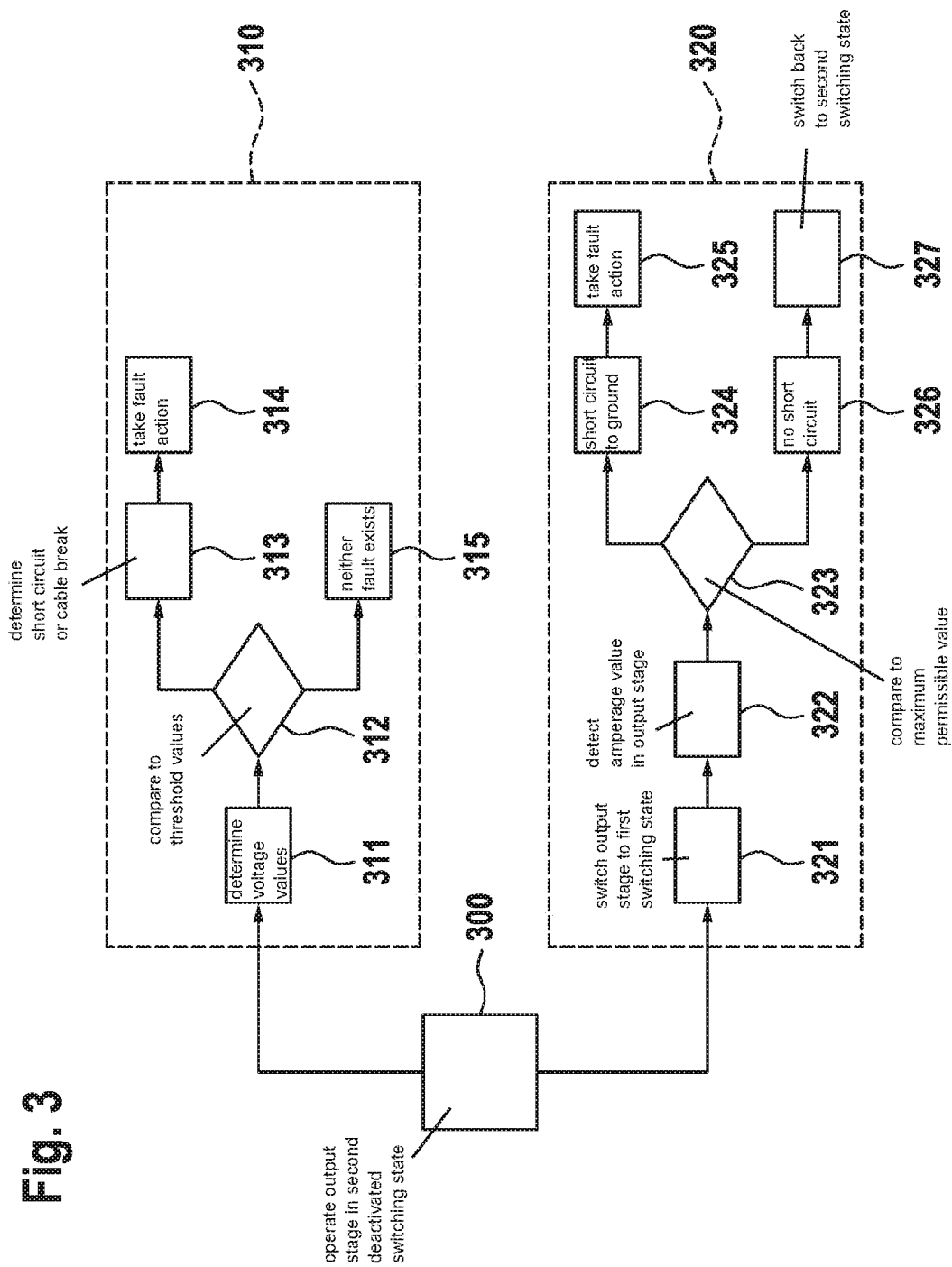

METHOD FOR CHECKING AN OUTPUT STAGE FOR CONTROLLING A LOAD

FIELD

The present invention relates to a method for checking an output stage for controlling a load and to a computing unit and a computer program for executing the method.

BACKGROUND INFORMATION

Circuit arrangements for controlling loads may comprise high-side branches or low-side branches. A grounded load may be connected to or disconnected from a supply voltage source using a so-called high-side switch. On the other hand, a load which is connected to a supply voltage may be connected to or disconnected from ground using a so-called low-side switch. Switching transistors, such as MOSFET transistors, may be provided as corresponding switches for this purpose.

Such circuit arrangements are often used in the automotive sector. For example, loads may be provided in motor vehicles, the loads being controllable using low-side switches in output stages of control devices. Such loads may be used, e.g., for motor vehicle functions such as fuel injection, heating, front and rear windshield heating, ventilation, air conditioning, interior lighting, etc.

Besides controlling the loads, such output stages are often also used to recognize load fault states. Fault states may include a cable break, in other words an unconnected load (an open load), meaning that a line to the load has been broken. In this case, the load is not connected to the corresponding high-side switch or low-side switch, for example. Another fault state may be a short circuiting of the load to ground or to the supply voltage source.

SUMMARY

The present invention provides a method for checking an output stage for controlling a load, and a computing unit and a computer program for executing the method. Advantageous developments of the present invention are described herein.

In accordance with an example embodiment of the present invention, an output stage is provided as a circuit arrangement, in particular for controlling a load. It is useful for the output stage to comprise one or more switches, each of which is designed as a switching transistor, for example as a MOSFET. The output stage may be designed as a high-side output stage with a high-side branch or a high-side switch for connecting or disconnecting a grounded load to or from a supply voltage source. Alternatively or additionally, the output stage may be designed as a low-side output stage with a low-side branch or a low-side switch, in particular for connecting or disconnecting a load which is connected to a supply voltage to or from ground.

The output stage may be switched to a first switching state or to a second switching state in order to control the load. In particular, the output stage may be activated, i.e., turned on, in one of these switching states and deactivated, i.e., blocked, in the other switching state. Depending on the switching state of the output stage, the load may either be activated, i.e., turned on, or deactivated, i.e., not turned on.

A check for a first fault state may be carried out in the first switching state. A check for a second fault state may be carried out in the second switching state. In particular, such fault states include a short circuit to the battery, a short circuit to ground or a cable break (open load). When the output stage is switched to the first switching state, it is not readily possible to check for the second fault state. Vice versa, it is not readily possible to check for the first fault state when the output stage is operating in the second switching state.

When the output stage is operating in the first switching state, the output stage is switched to the second switching state for a first pre-defined and/or pre-definable control duration, and the check for the second fault state is carried out. After the first control duration, the output stage is switched back to the first switching state. Alternatively or in addition, and in corresponding fashion, when the output stage is operating in the second switching state, the output stage is switched to the first switching state for a second pre-defined and/or pre-definable control duration, and the check for the first fault state is carried out. After the second control duration, the output stage is switched back to the second switching state.

The method makes it possible to check the output stage at any time for all possible fault states regardless of the switching state in which the output stage is currently operating. Thus, for example, when the output stage is operating in the first switching state, the method still allows a check for the second fault state to be carried out in an economical, uncomplicated way. Similarly, when the output stage is operated in the second switching state the check for the first fault state may be carried out in an economical and uncomplicated way. In particular, this makes continuous monitoring or checking of the output stage possible.

The method allows fault states to be identified early, and corresponding counter-measures may be introduced in order to correct the fault state and avoid damages to the output stage, the load or other elements. Furthermore, in particular, no additional hardware or additional elements are required for the method, such that the output stage does not need to be redesigned. The method may thus be implemented in output stages in a simple and constructionally economical manner, for example for retrofitting purposes.

Advantageously, the first control duration and the second control duration are each pre-defined such that an operating state of the load does not change as a result of the back-and-forth switching. The control durations may expediently be considered to be durations which have no effect on the operating state of the load. This expediently ensures that no change in the switching state of the output stage will have a negative effect on the load or on the control of the load, and that the load will not be unintentionally affected and in particular not unintentionally deactivated or activated. For example, when the output stage is operating in the first switching state and the load is controlled or activated in this state, the switch to the second switching state is short enough that the load always remains activated and is not deactivated as a result. When the output stage is operating in the second switching state and the load is deactivated in this state, for example, the switch to the first switching state is short enough that the load is not activated as a result. Furthermore, the first control duration and the second control duration are each pre-defined such that the overall system is brought to a steady state in particular, and that a meaningful, robust diagnosis result may be obtained from the corresponding check. In particular the first control duration and the second control duration may each be pre-defined or parametrized externally.

The output stage is preferably switched to the second switching state for the first control duration using a first pulse or test pulse having a first pulse width or pulse duration. Alternatively or in addition, the output stage is switched to the first switching state for the second control duration using a second pulse or test pulse having a second pulse width or pulse duration. Similar to the description above, the pulse widths or durations of these pulses are expediently pre-defined to be narrow enough such that a load state does not change and the load is not therefore unintentionally switched. Furthermore, the pulse widths and durations are selected to be wide enough to bring the overall system to a steady state and to obtain a robust diagnosis result. In particular, the first pulse width and duration and the second pulse width and duration may each be pre-defined or parametrized externally.

It is preferable for the first fault state or the second fault state to be a short circuit to ground or a short circuit to the battery, or to be a cable break. As explained at the outset, a cable break (open load) involves a line leading to the load which has been broken such that the load for example is not connected to a corresponding high-side or low-side switch of the output stage.

According to a preferred embodiment of the present invention, the first switching state is a turned-on state and the first fault state is a short circuit to ground. The second switching state is preferably a turned-off state and the second fault state is a short circuit to the battery and/or a cable break. In particular, a check for a short circuit to the battery and/or for a cable break may only be carried out when the output stage has been blocked or deactivated. A check for a short circuit to ground may only be carried out when the output stage is active. Thus, when the output stage is being operated in the turned-on, active state, it is preferable within the scope of the method to switch to the deactivated state for the corresponding pre-defined control duration in order to check for a short circuit to the battery and/or for a cable break. When the output stage is operated in the turned-off, deactivated state, it is preferable within the scope of the method to switch to the activated state for the corresponding pre-defined control duration in order to check for a short circuit to ground.

Of course, it is understood that the second switching state may also be a turned-on state and the first switching state may be a turned-off state without any limitation in generality. Accordingly, the second fault state may preferably be a short circuit to ground and the first fault state may be a short circuit to the battery and/or a cable break.

Preferably, a voltage is determined and evaluated at a voltage divider and/or current overflow monitoring is carried out during the checks for the first fault state and/or the second fault state. As explained above, the check for a short circuit to the battery and/or for a cable break in particular may only be carried out when the output stage is blocked or deactivated. This check is based in particular on the evaluation of a diagnostic voltage divider at an output stage output. In particular, for this purpose a voltage is determined and evaluated at such a voltage divider, the voltage being in particular subjected to a threshold value comparison. A check for a short circuit to ground may in particular only be carried out when the output stage is active. Current overflow monitoring may be used for this particular check.

For example, German Patent Application No. DE 102016204806 A1 describes ways to detect faults in output stages and further details may be found here in this regard.

It is advantageous to use the output stage in a motor vehicle, in particular in a control device of a motor vehicle. In particular, the output stage is used here to control motor vehicle functions. Accordingly, the load may be used for vehicle functions such as fuel injection, heating, front and rear windshield heating, ventilation, air conditioning, interior lighting, etc. in the motor vehicle, for example.

The present invention is particularly advantageous for use in inductive loads since they involve a certain amount of electrical inertia, and therefore changes in the control signal occur with a time delay. Thus, brief switching of the control signal does not have an effect on the operating state of the load in this case (for example activation of an electromagnetic actuator).

The present invention is also particularly advantageous for resistive thermal loads since they also involve a certain amount of electrical inertia, and therefore changes in the control signal also occur with a time delay. Thus, brief switching of the control signal does not have an effect on the operating state of the load in this case either (for example heaters becoming hot).

An example computing unit according to the present invention, for example a control device of a motor vehicle, is designed, in particular programmatically, to carry out a method according to the present invention.

It is also an advantage to implement the example method in the form of a computer program since this may be done at a very low cost, in particular if a control unit which executes the method is already being used for other tasks and is therefore available in any case. Suitable data storage media for providing the computer program include magnetic, optical and electronic storage media such as hard disks, flash memories, EEPROMs, DVDs, and others. It is also possible to download a program via computer networks (Internet, Intranet, etc.).

Other advantages and developments of the present invention can be found in description herein and the figures.

The present invention is illustrated schematically with the aid of exemplary embodiments and is described below with reference to the figures.

BRIEF DESCRIPTION OF THE DRAWINGS

FIGS. 2 and 3 each show schematically a preferred specific embodiment of a method according to the present invention as a block diagram.

DETAILED DESCRIPTION OF EXAMPLE EMBODIMENTS

Figure 1A:
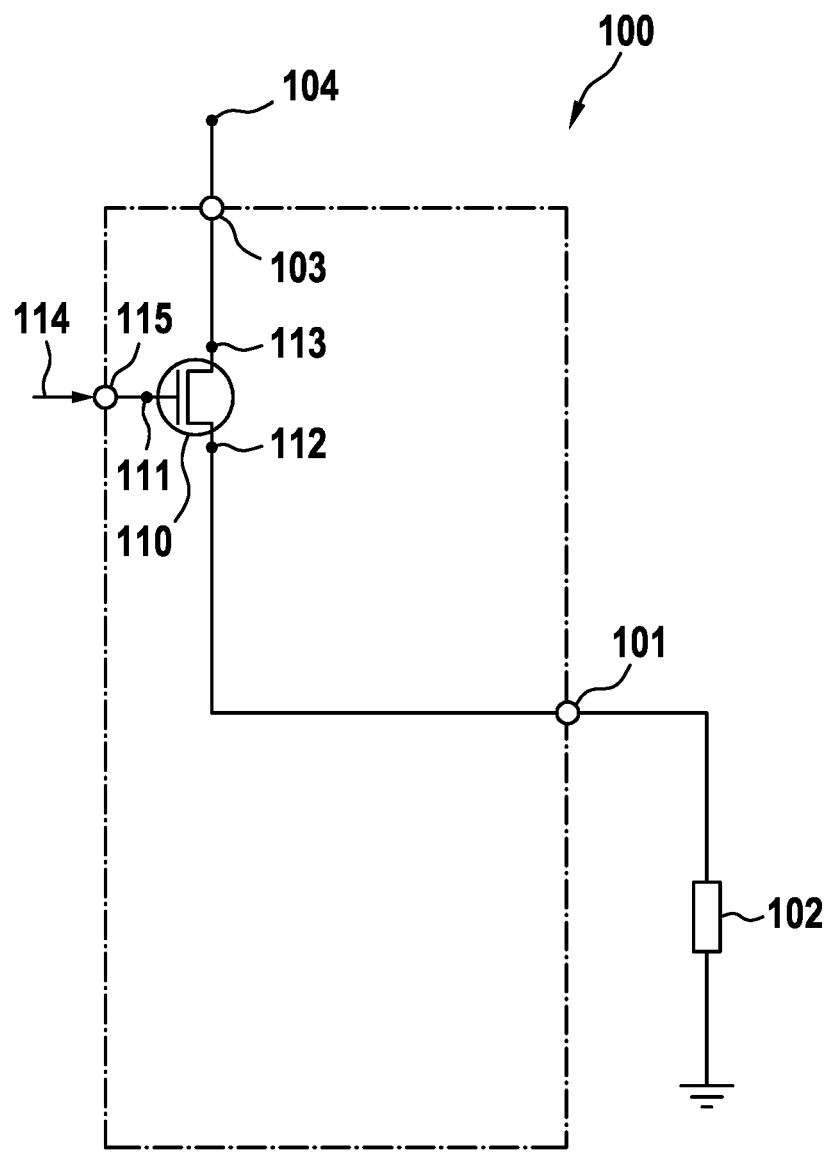
FIGS. 1a and 1b each show schematically an output stage for controlling a load which may be checked for fault states in a preferred embodiment of a method according to the present invention.

Shown schematically in FIG. 1a is an output stage circuit 100 for controlling a load 102, it being possible to check the load for fault states in a preferred specific embodiment of a method according to the present invention.

For example, output stage 100 and load 102 may be used in a motor vehicle. In particular, in this case the output stage may be integrated into a control device of the motor vehicle. For example, load 102 may be designed as a resistive thermal load in the form of a rear windshield heater and output stage 100, or the corresponding control device, may be provided for controlling the rear windshield heater.

Load 102 is connected to a circuit terminal 101 of output stage 100 and also to ground. A supply voltage source 104, for example a motor vehicle battery having a voltage value of 12V, is connected at a potential terminal 103 of output stage 100.

Output stage 100 is provided as a high-side output stage in this example in order to connect or disconnect circuit terminal 101, and thus load 102, to or from supply voltage source 104.

For this purpose, output stage 100 comprises a switch 110 which is designed as a MOSFET with a control terminal or gate terminal 111, a source terminal 112 and a drain terminal 113. The switch may be controlled via control terminal 111 by way of a control signal 114 which may be received at a control input 115 of output stage 100.

Of course, output stage 100 may comprise further elements, for example capacitors or buffer capacitors.

Output stage 100 may also be designed as a low-side output stage in order to connect load 102 to ground. A corresponding low-side output stage is shown schematically in FIG. 1b, identical reference numerals in FIGS. 1a and 1b signifying the same or identically constructed elements.

Figure 1B:
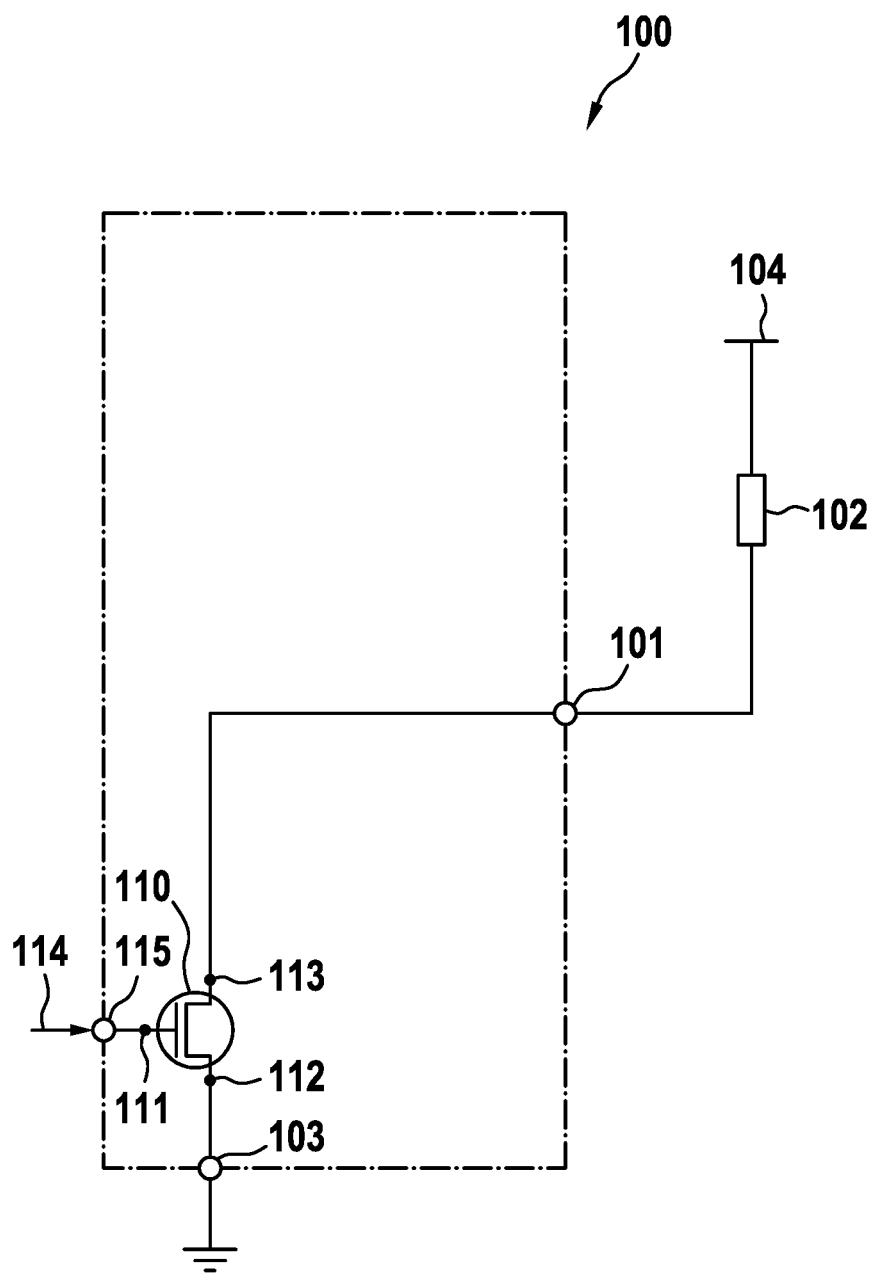

In the example of FIG. 1b, load 102 is connected between circuit terminal 101 and supply voltage source 104. Potential terminal 103 is connected to ground. The purpose of switch 110 is therefore to connect or disconnect circuit terminal 101, and thus load 102, to or from ground.

In a preferred embodiment of a method according to the present invention shown schematically as a block diagram in FIG. 2, the output stage is checked for the presence of fault states.

The following explanations refer to a high-side output stage, as shown in FIG. 1a, as an example only but also apply in analogous fashion to a low-side output stage as shown in FIG. 1b.

In a step 200, output stage 100 is actively operated in a first switching state, i.e. switch 110 is closed by way of a corresponding control signal 114 in order to connect load 102 to supply voltage source 104.

In this first, active switching state, a check 210 may be carried out for a short circuit of load 102 to ground. Overcurrent monitoring is performed for this purpose. In the process, in step 211 an amperage value is detected in output stage 100 and in step 212 this value is compared to a permissible maximum value. If the detected amperage value is below the maximum value, an evaluation is performed in step 215 to determine that there is no short circuit to ground.

On the other hand, if the detected amperage value exceeds the maximum value, an evaluation is performed in step 213 to determine that there exists a short circuit to ground, and a corresponding fault action is taken (step 214), for example a fault entry may be generated in the control device and a warning message may be issued by way of an on-board computer in the motor vehicle.

In the active, first switching state of output stage 100, it is not readily possible to perform a check for a short circuit of load 102 to battery 104 or for a cable break. Therefore, the method provides a way to perform a check 220 for these two fault states as follows.

In a step 221, output stage 100 is switched from the first, active switching state to a second, deactivated switching state for a first control duration. To this end, a corresponding control signal 114 is applied at control input 115 in the form of a first test pulse having a first pulse width so that switch 110 is opened for the first control duration and so that load 102 is disconnected from supply voltage source 104.

Subsequently, in step 222 voltage values of a voltage divider at an output stage output are determined and compared to threshold values in step 223. Depending on the results of these comparisons, in step 224 it is either determined that there is a short circuit to the battery and/or there is a cable break, or in step 226 it is determined that neither of these two fault states exists.

Similar to step 214, if a fault state is identified in step 225, a corresponding action is taken, for example a fault entry is issued and a warning message is output.

If in step 226 it is determined that neither of the two fault states is in effect, in step 227 the output stage is re-activated after expiration of the first control duration and switch 110 is closed again.

The present method also provides that output stage 100 may be checked for fault states if the output stage is operated not in the first, activated switching state as in step 200, but in the second, deactivated switching state as explained below with reference to FIG. 3, which schematically shows a preferred specific embodiment of a method according to the present invention similar to FIG. 2 as a block diagram.

The following explanations also refer to a high-side output stage by way of example, but also apply analogously to a low-side output stage.

In step 300, output stage 100 is operated in the second, deactivated switching state, so that switch 110 is open and load 102 is separated from supply voltage source 104.

In the second, deactivated switching state, a check 310 may be carried out for a short circuit of load 102 to battery 104 or for a cable break. In the process, in step 311 voltage values of a voltage divider at an output stage output are determined in a fashion analogous to step 222 and are compared to threshold values in step 312. Depending on the results of these comparisons, in step 313 it is either determined that there is a short circuit to the battery and/or that there is a cable break, or in step 315 it is determined that neither of these two fault states exists. If a fault state is determined, in step 314 a fault entry is issued as a fault action, and a warning message is output.

Since in the second, deactivated switching state of output stage 100, it is not readily possible to perform a check for a short circuit to ground, the present method provides for a check 320 for this fault state to be performed as follows.

In step 321, output stage 110 is switched to the first switching state for a second control duration by applying a corresponding control signal 114 at control input 115 in the form of a second test pulse with a second pulse width so that switch 110 is closed for the second control duration and so that load 102 is connected to supply voltage source 104.

Subsequently, overcurrent is monitored by detecting an amperage value in output stage 100 in step 322 and comparing it with a permissible maximum value in step 323. If the detected amperage value exceeds the maximum value, in step 324 it is determined that a short circuit to ground is in effect and in step 325 a fault entry is issued and a warning message is output.

If the detected amperage value is below the maximum value, in step 326 an evaluation is made that there is no short circuit to ground. After the second control duration, in step 327 output stage 100 is switched back to the second switching state and switch 110 is opened again.

What is claimed is:

1. A method for checking an output stage for controlling a load, wherein, to control the load the output stage is switched to one of a first switching state and a second switching state, wherein, in the first switching state of the output stage, a check is carried out for a first fault state, and in the second switching state of the output stage, a check is carried out for a second fault state, the method comprising the following steps:

when the output stage is operating in the first switching state:

switching the output stage to the second switching state for a first control duration;
checking for the second fault state; and
returning the output stage to the first switching state after the first control duration; and
when the output stage is operating in the second switching state:
switching the output stage to the first switching state for a second control duration;
checking for the first fault state; and
returning the output stage to the second switching state after the second control duration, wherein the first control duration and the second control duration are each pre-defined such that a state of the load does not change during the first control duration and during the second control duration and such that the load will not be activated or deactivated as a result of a back-and-forth switching between the first switching state and the second switching state.

2. The method as recited in claim 1, wherein at least one of: (i) the output stage is switched to the second switching state for the first control duration using a first pulse with a first pulse width, and (ii) the output stage is switched to the first switching state for the second control duration using a second pulse with a second pulse width.

3. The method as recited in claim 1, wherein the first fault state or the second fault state is: (i) a short circuit to ground, or (ii) a short circuit to the battery, or (iii) a cable break.

4. The method as recited in claim 1, wherein the first switching state is a turned-on state, the second switching state is a turned-off state, the first fault state is a short circuit to ground, and the second fault state is one of: (i) a short circuit to the battery and (ii) a cable break.

5. The method as claim 1, wherein during the checking at least one of for the first fault state and for the second fault state at least one of: (i) a voltage is determined and evaluated at a voltage divider, and (ii) overcurrent monitoring is carried out.

6. The method as recited in claim 1, wherein the output stage is in a control device of a motor vehicle.

7. A computing unit configured to check an output stage for controlling a load, wherein, to control the load the output stage is switched to one of a first switching state and a second switching state, wherein, in the first switching state of the output stage, a check is carried out for a first fault state, and in the second switching state of the output stage, a check is carried out for a second fault state, the computing unit configured to at least one of:
when the output stage is operating in the first switching state:
switch the output stage to the second switching state for a first control duration;
check for the second fault state; and
return the output stage to the first switching state after the first control duration; and
when the output stage is operating in the second switching state:
switch the output stage to the first switching state for a second control duration;
check for the first fault state; and
return the output stage to the second switching state after the second control duration, wherein the first control duration and the second control duration are each pre-defined such that a state of the load does not change during the first control duration and during the second control duration and such that the load will not be activated or deactivated as a result of a back-and-forth switching between the first switching state and the second switching state.

8. A non-transitory machine-readable storage medium on which is stored a computer program for checking an output stage for controlling a load, wherein, to control the load the output stage is switched to one of a first switching state and a second switching state, wherein, in the first switching state of the output stage, a check is carried out for a first fault state, and in the second switching state of the output stage, a check is carried out for a second fault state, computer program, when executed by a computer, causing the computer to perform at least one of the following steps:
when the output stage is operating in the first switching state:
switching the output stage to the second switching state for a first control duration;
checking for the second fault state; and
returning the output stage to the first switching state after the first control duration; and
when the output stage is operating in the second switching state:
switching the output stage to the first switching state for a second control duration;
checking for the first fault state; and
returning the output stage to the second switching state after the second control duration, wherein the first control duration and the second control duration are each pre-defined such that a state of the load does not change during the first control duration and during the second control duration and such that the load will not be activated or deactivated as a result of a back-and-forth switching between the first switching state and the second switching state.

9. The method as recited in claim 1, wherein at least one of the first control duration and the second control duration is pre-defined externally.

10. The computing unit as recited in claim 7, wherein at least one of the first control duration and the second control duration is pre-defined externally.

11. The non-transitory machine-readable storage medium as recited in claim 8, wherein at least one of the first control duration and the second control duration is pre-defined externally.

* * * * *